US012705407B2

(12) United States Patent
Stahlfeld et al.

(10) Patent No.: US 12,705,407 B2
(45) Date of Patent: Aug. 11, 2026

(54) SCALABLY GENERATING DISTRIBUTION GRID TOPOLOGY

(71) Applicant: X Development LLC, Mountain View, CA (US)

(72) Inventors: Phillip Ellsworth Stahlfeld, Mountain View, CA (US); Amanda McNary, Redwood City, CA (US); Peter Evans, Los Altos Hills, CA (US); Leo Francis Casey, San Francisco, CA (US); Alaeddine Mokri, San Jose, CA (US); Page Furey Crahan, San Francisco, CA (US); Raymond Daly, Palo Alto, CA (US); Siyuan Xin, Mountain View, CA (US); Joel Fraser Atwater, Danville, CA (US); Bin Ni, Fremont, CA (US); Peter Light, San Francisco, CA (US); Spencer James Connaughton, New York, NY (US)

(73) Assignee: X Development LLC, Mountain View, CA (US)

( * ) Notice: Subject to any disclaimer, the term of this patent is extended or adjusted under 35 U.S.C. 154(b) by 203 days.

(21) Appl. No.: 17/091,976

(22) Filed: Nov. 6, 2020

(65) Prior Publication Data

US 2021/0141969 A1 May 13, 2021

Related U.S. Application Data

(60) Provisional application No. 62/933,293, filed on Nov. 8, 2019.

(51) Int. Cl.
*G06F 7/48* (2006.01)
*G05B 19/042* (2006.01)
(Continued)

(52) U.S. Cl.
CPC .......... *G06F 30/18* (2020.01); *G05B 19/042* (2013.01); *G06F 16/29* (2019.01); *G06F 30/12* (2020.01);
(Continued)

(58) Field of Classification Search
CPC .......... G06F 30/18; G06F 16/29; G06F 30/12; G06F 30/27; G05B 19/042;
(Continued)

(56) References Cited

U.S. PATENT DOCUMENTS 7,860,702 B1 12/2010 Evans et al.
8,805,598 B2 8/2014 Shaffer et al.
(Continued)

OTHER PUBLICATIONS

Schweitzer, Eran, et al. "A Matlab GUI for the generation of distribution grid models." International ETG Congress 2015; Die Energiewende-Blueprints for the new energy age. VDE, 2015.*
(Continued)

*Primary Examiner* — Nithya J. Moll
(74) *Attorney, Agent, or Firm* — Fish & Richardson P.C.

(57) ABSTRACT

Methods, systems, and apparatus, including computer programs encoded on computer storage media, for generating a representation of an electric power grid. One of the methods includes obtaining respective datasets, identifying one or more predictive models for each of the respective datasets that are each configured to processes a category of data to generate an output that specifies a partial representation of the electric power grid; and aggregating the respective outputs in accordance with a set of predetermined rules to generate a final representation of the electric power grid.

22 Claims, 3 Drawing Sheets

(51) Int. Cl.

| | |
|---|---|
| ***G06F 16/29*** | (2019.01) |
| ***G06F 30/12*** | (2020.01) |
| ***G06F 30/18*** | (2020.01) |
| ***G06F 30/27*** | (2020.01) |
| ***G06N 5/02*** | (2023.01) |

(52) U.S. Cl.
CPC ............... *G06F 30/27* (2020.01); *G06N 5/02* (2013.01); *G05B 2219/2639* (2013.01)

(58) Field of Classification Search
CPC .. G05B 2219/2639; G06N 5/02; Y02B 90/20; Y02E 60/00; Y04S 10/40; Y04S 20/00; Y04S 40/20; H02J 13/00001; H02J 2203/20
See application file for complete search history.

(56) References Cited

U.S. PATENT DOCUMENTS

| | | | | |
|---|---|---|---|---|
| 11,146,103 | B1 * | 10/2021 | Davies | H02J 3/383 |
| 2013/0024043 | A1 * | 1/2013 | Shaffer | H02H 7/30 700/297 |
| 2013/0066600 | A1 * | 3/2013 | Rousselle | H02J 3/00 703/1 |
| 2017/0371308 | A1 * | 12/2017 | Ghosh | G05B 15/02 |
| 2018/0156851 | A1 | 6/2018 | Driscoll et al. | |

OTHER PUBLICATIONS

Akhmatov, Vladislav, and Hans Knudsen. "An aggregate model of a grid-connected, large-scale, offshore wind farm for power stability investigations-importance of windmill mechanical system." International Journal of Electrical Power & Energy Systems 24.9 (2002): 709-717.*

Dennetière, S., et al. "Use of XML to import SCADA data into EMTP." 2011 IEEE Power and Energy Society General Meeting. IEEE, 2011.*

Yang, Jian, and Max D. Anderson. "PowerGraf: an educational software package for power systems analysis and design." IEEE Transactions on Power Systems 13.4 (1998): 1205-1210.*

Silva, L. A. Z., et al. "Automatic recognition of electrical grid elements using convolutional neural networks." 2018 22nd International Conference on System Theory, Control and Computing (ICSTCC). IEEE, 2018. (Year: 2018).*

Github.com [online] "How to Replicate FBIs distribution grid prediction model," Jan. 24, 2019, retrieved on Feb. 25, 2021, retrieved from URL<:https://github.com/facebookresearch/ma ny-to-many-dijkstra/blob/master/Model%20Tu torial%20-%20PDF.pdf> 35 pages.

PCT International Search Report and Written Opinion in Appln. No. PCT/US2020/059496, dated Feb. 25, 2021, 16 pages.

International Preliminary Report on Patentability in Appln. No. PCT/US2020/059496, dated May 19, 2022, 9 pages.

* cited by examiner

SCALABLY GENERATING DISTRIBUTION GRID TOPOLOGY

CROSS-REFERENCE TO RELATED APPLICATION

This application claims priority to U.S. Provisional Application No. 62/933,293, filed on Nov. 8, 2019. The disclosure of the prior application is herein incorporated by reference.

BACKGROUND

This specification relates to determining topologies of electric power grid.

Electric power grids contain thousands of miles of wires, millions of poles, and other expensive assets, e.g., transformers, capacitors, and switches. One fundamental building block of a distribution network within a grid is called a "feeder." A feeder is the set of assets connecting a group of loads to a substation. For example, one feeder might be used to connect a group of houses on one side of a street to a nearby substation.

Determining topologies of an electric power grid is a process of determining respective locations of, and corresponding connections between, the assets that are included in the electric power grid. For a variety of reasons, electric utility companies too often do not have good information about where their assets are located, or how their assets are connected.

SUMMARY

This specification describes technologies for determining representations of an electric power grid from an aggregation of available information or signals, which may include one or more categories of imagery data, sensor data, LIDAR data, or utility data. Implementations of the technologies use a grid representation generation engine to generate a final representation of the grid which identifies substantially all assets included in the grid or a portion of the grid, as well as corresponding connections between the assets, i.e., the "topology" of the grid, and, optionally, physical properties or characteristics of the assets. In some implementations, the assets include a line, a pole, a crossarm, a transformer, a switch, an insulator, a recloser, a sectionalizer, a capacitor bank, including switched capacitors, a load tap changer, or a tap. Notably, each such asset may be located overhead, underground, or partially overhead and partially underground.

According to an aspect, there is provided a computer-implemented method of generating a representation of an electric power grid. The method comprises obtaining two or more datasets comprising data indicate a presence of or operation of assets of the electric power grid in a geographical region that has the electric power grid, each dataset including data of a particular kind; identifying one or more respective predictive models for each dataset, each predictive model being configured to process the respective kind of data of the respective dataset to generate a corresponding output that specifies a respective partial representation of the electric power grid; generating a respective partial representation of the electric power grid from each of the predictive models that have been identified for the two or more datasets; and aggregating, in accordance with a set of aggregation rules, the respective partial representations to generate a final representation of the electric power grid.

Obtaining two or more datasets may comprise obtaining two or more of a first dataset, a second dataset, a third dataset, or a fourth dataset, wherein: the first dataset comprises imagery data taken in the geographical region, the first dataset comprising one or more categories of imagery data, the imagery data in each category including imagery showing assets of the electric power grid in the geographical region; the second dataset comprises sensor data taken in the geographical region, the second dataset comprising one or more categories of sensor data, the sensor data in each category including sensor measurements of assets of the electric power grid in the geographical region; the third dataset comprises LIDAR data taken in the geographical region, the third dataset comprising one or more categories of LIDAR data; and the fourth dataset comprises utility data taken in the geographical region, the fourth dataset comprising one or more categories of utility data.

Obtaining two or more datasets may comprise obtaining the first dataset, the second dataset, the third dataset, and the fourth dataset.

The electric power grid may comprise one or more transmission networks and one or more distribution networks; and generating the representation of the electric power grid may comprise generating a representation of feeders within the electric power distribution networks, and generating a representation of high voltage power lines that connect one or more power generators to one or more substations within the electric power transmission networks.

The method may further comprise providing the generated representation of the electric power grid for display on a user device.

Generating the corresponding output that specifies the partial representation of the electric power grid may comprise generating data that identifies respective geographic locations and categories of the assets of the electric power grid in the geographical region.

Generating the corresponding output that specifies the partial representation of the electric power grid may comprise generating data that identifies respective physical characteristics of the assets of the electric power grid in the geographical region.

Generating the corresponding output that specifies the partial representation of the electric power grid may comprise generating data that identifies respective connections between respective assets of the electric power grid.

The one or more categories of imagery data may comprise satellite imagery, aerial imagery, drone imagery, hyperspectral imagery, or infrared imagery.

The one or more categories of sensor data may comprise distribution line sensor data, smart meter readings, equipment submeter readings, consumer device readings, including readings from sensors for home accessories and mobile devices, standalone sensor data, including readings from sensors in wall plugs or breakers, or ground-based field sensor data.

The one or more categories of LIDAR data may comprise data obtained by respective LIDAR sensors on-board one or more moving ground or aerial vehicles.

The one or more categories of utility data may comprise data specifying utility-recorded asset locations, data collected through supervisory control and data acquisition (SCADA) system, or data specifying input from line crews.

The one or more categories of sensor data or utility data may comprise voltage, current, or electromagnetic field intensity measurements.

The set of aggregation rules may comprise one or more disambiguation rules, and wherein aggregating the respective outputs generated by the predictive models comprises disambiguating the respective outputs in accordance with the one or more disambiguation rules.

The one or more disambiguation rules may comprise one or more of: removing a particular output of one predictive model based on outputs generated by other predictive models that agree with one another and that outnumber the particular output, accepting outputs in accordance with associated confidence scores, or rejecting outputs that violate one or more assets placement rules.

The method may further comprise receiving a user input specifying one or more modifications to the final representation; and regenerating the final representation by incorporating the user-specified modifications.

Generating the final representation of the electric power grid may comprise determining, based on processing the aerial imagery data using a first predictive model, a topology of the electric power grid; and identifying, based on processing localized data using a second predictive model different from the first predictive model, the assets on the topology.

The method may further comprise using the automatically generated topology to direct electricity to a first area instead of a second area.

According to another aspect, there is provided a system comprising one or more computers and one or more storage devices storing instructions that are operable, when executed by the one or more computers, to cause the one or more computers to perform the operations of the above method aspect.

According to a further aspect, there is provided a computer storage medium encoded with instructions that, when executed by one or more computers, cause the one or more computers to perform the operations of the method aspect.

It will be appreciated that features described in the context of one aspect may be combined with features described in the context of another aspect.

The subject matter described in this specification can be implemented in particular embodiments so as to realize one or more of the following advantages. For a variety of reasons, companies running electric power grids too often do not have good information about where their assets are located, or how their assets are connected. The predictive grid representation generation technology described in this specification can accurately and scalably map out an electric power grid without consuming excessive amount of human resources and time that is otherwise required for determining grid topologies, assets locations, or both through manual survey work. As such, the technology provides tremendous value to companies operating and maintaining the grid. As a particular example, for a utility company that possesses sufficient amount of aerial imagery and/or geotagged pictures from routine maintenance or repair jobs, the technology described in this specification can allow for the utility company to automatically obtain a highly accurate and up-to-date representation of the electric power grid based on the asset information that is readily available and without the need of additionally dispatching its employees in doing any manual data collection or decision-making.

The technology described in this specification can automatically predict the entire representation of an electric power grid or a portion of an electric power grid, i.e., including connections between and respective locations of all assets from power plants to substations and to loads.

Generating a clear representation of the electric power grid has further benefits, including, for example, prevention of fires caused by defective assets within the grid, improvement in efficiency of maintenance work, facilitation of adding renewables to the grid, automated interconnection studies, and optimized automatic load balancing.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
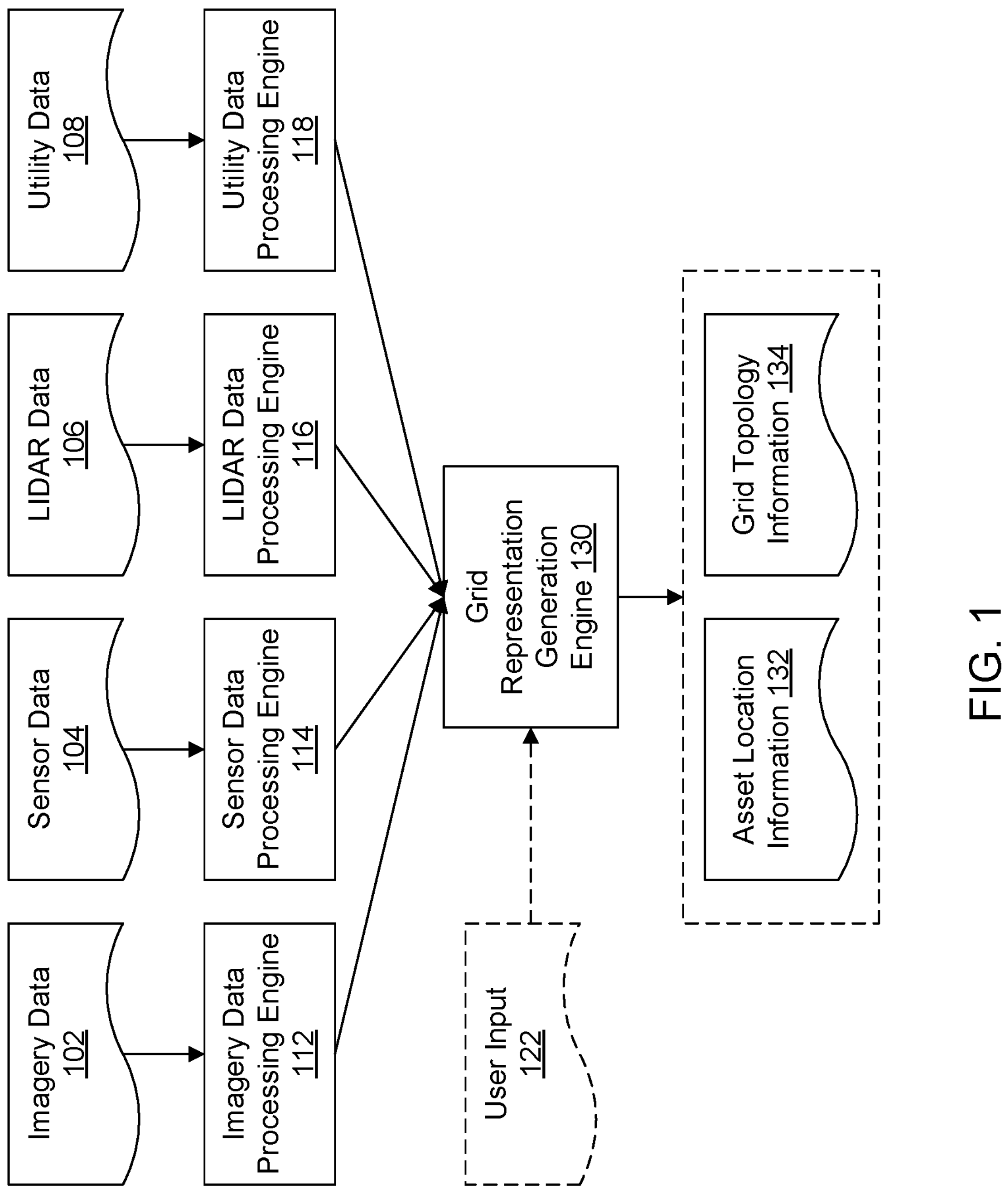
FIG. 1 is a block diagram showing elements of a grid representation generation engine in the context of predicting representations of electric power grid.

FIG. 1 is a block diagram showing elements of a grid representation generation engine 130 in the context of predicting representations of electric power grid. The elements include an imagery data processing engine 112, a sensor data processing engine 114, a LIDAR data processing engine 116, and a utility data processing engine 118. The data processing engines are configured to process data obtained from datasets including an imagery dataset 102, a sensor dataset 104, a LIDAR dataset 106, and a utility dataset 108, and to generate partial representations of the electric power grid, respectively. Each data processing engine in turn includes one or more predictive models. The predictive models can be machine learning models, heuristic models, deterministic models, or a combination thereof.

The predictive models can be implemented using a variety of different machine learning architectures. For example, the predictive models can be implemented as neural networks, random forest models, support vector machine (SVM) models, or as any other type of trainable machine learning models. The predictive models need not have the same configuration or architecture. Each predictive model can be configured, e.g., through training, to process a corresponding category of data and generate an output that specifies a partial representation of the electric power grid from which the grid topology or asset locations can be derived.

Training the predictive models to generate the outputs typically involves training the models, by using any of a variety of appropriate machine learning techniques, e.g., a gradient-based backpropagation training technique. The models can be trained on training data that is generated or derived from the datasets to determine, e.g., from initial values, trained values of a set of model parameters. To employ supervised training techniques during training, the datasets can further be augmented using assigned labels or synthetic labels, e.g., automatically assigned labels or labels derived from outputs computed by another, already-trained machine learning model based on processing either the same or different kind of data from the training dataset. The labels can define the known model outputs, i.e., the ground truth output that should be generated by the predictive model during training based on processing data from the input datasets. Example labels include bounding boxes, confidence scores, or categories, to name just a few examples.

The data processing engines 112-118 implementing these predictive models can generate respective partial representations of the electric power grid from the data that is available for processing by each engine. The representations can characterize one or more aspects of the electric power grid in a variety of ways.

For example, the data processing engine can implement an object detection neural network configured to identify candidate regions within input data that are predicted to include specific electric power grid assets of interest. The object detection neural network can for example generate a detection output for the input data that includes bounding boxes that specify the boundaries of the candidate regions that include the power grid assets.

As another example, the data processing engine can implement an object classification neural network configured to classify input data as including representations of assets from one or more asset categories. For example, the object classification neural network can generate a classification output for input data. The output can include a respective score for each of the one or more asset categories that represents a likelihood that the input data represents an asset that belongs to the asset category.

As another example, the data processing engine can implement an object prediction neural network configured to estimate obscured assets represented in input data. Generally, an obscured asset refers to an asset that is at least partially occluded from a sensor used to collect the data. For example, the asset can be occluded by one or more other objects in the field of view of the sensor. As another example, the asset can be an underground asset, e.g., an underground power line, electrical cable, or wire. For example, the data processing engine can generate an output that specifies an estimated location in the input data of each of one or more obscured assets.

As another example, the data processing engine can implement a semantic segmentation neural network configured to divide input data into multiple regions, where the assets within each region belongs to a different one of multiple feeders. For example, the data processing engine can generate an output that identifies for each asset characterized by the input data a particular feeder to which the asset belongs.

As another example, the data processing engine can implement a cascaded combination of a first predictive model, e.g., a convolutional neural network, configured to identify utility poles and/or connecting lines from aerial imagery of a geographical region, and a second predictive model configured to identify the assets (e.g., crossarms, transformers, insulators, switches, reclosers, risers, capacitors, etc.) attached to each of the poles and/or connecting lines identified by the first predictive model.

As yet another example, the data processing engine can implement an anomaly detection model that predicts when two or more assets, e.g., various household appliances that reside in neighboring addresses, are connected to the same phase or feeder. For example, a predictive model can be configured to monitor real-time sensor readings, e.g., voltage or current measurements and, in response to detecting the same or substantially similar anomalous readings from two assets during a same time period, predict that the two asset are connected to the same phase/feeder. For example, the data processing engine can generate an output that identifies for each anomalous asset the particular feeder to which the asset belongs.

The example of FIG. 1 shows a total of four data processing engines, i.e., data processing engines 112-118, each configured to process a respective kind of data, i.e., data inputs 102-108. However, the data processing engines need not have a one-to-one correspondence with data inputs, and there may be a different number of data processing engines, or a different number of data inputs than what is illustrated in FIG. 1.

The grid representation generation engine 130 is configured to aggregate all available signals, including (i) data from the datasets 102-108, (ii) information derived from the data, (iii) respective outputs generated by the data processing engines, (iv) information derived from the respective outputs, or a combination thereof and generate a final representation of the electric power grid which includes asset location information 132 and grid topology information 134. In some cases, the grid representation generation engine is further configured to provide for display on a user device the generated representation of the electric power grid.

In particular, the final representation can identify respective geographic locations and classification of the assets of the electric power grid. The respective locations within a geographical area can be defined with reference to, for example, a map of the geographical area or an image showing the geographical area. The classification can be, for example, a type, a class, a group, a category, or an operating condition. The final representation can specify the topology of the grid, i.e., respective connections and/or interrelations between these assets included in the grid. The connection can take the form of, for example, wires, lines, or cables, which are either above-ground or under-ground. In addition, the final representation can specify respective physical characteristics of the assets. The physical characteristics can be, for example, a voltage rating of a transformer, or a length of a segment of a power line or a transmission line.

Typically, the final representation will include a representation of both an electric power transmission network and an electric power distribution network within the same electric power grid. In brief, the electric power transmission network connects power plants to substations, and the electric power distribution network connects the substations to end consumers (industries, corporations, homeowners, etc.) For example, the final representation can include respective representations of one or more feeders within the electric power distribution network and power lines that connect one or more power generators to one or more substations within the electric power transmission networks.

In various cases, the data processing engines may generate conflicting or ambiguous outputs. That is, the respective partial representations of the electric power grid that are generated by the data processing engines may not fully comply with or complement each other. In such cases, aggregating the outputs also involves disambiguating the outputs by clarifying any uncertainties and removing any discrepancies or conflicts between respective partial representations. Aggregating the respective outputs generated by the processing engines will be described in more detail below.

The grid representation generation engine is also configured to receive, e.g., through an application programming interface (API) made available by the engine, a user input 122 either during or after the generation of the final representation of the electric power grid.

For example, the user input can include data that is generated after the datasets have been obtained and is therefore not processed by the data processing engines. As another example, the user input can specify a modification to the generated final representation, including, for example, addition of an identification of a currently unidentified asset to the final representation, deletion of an incorrectly identified asset from the final representation, or shift of a corresponding identified location of an asset.

As another example, the user input can specify a modification to the respective configuration of the data processing engines, or an identification of different predictive models that are currently not in use by the data processing engines.

As yet another example, the user input can specify supplemental or reference data that can aid or assist the grid representation generation engine in generating the final representations of electric power grid. For example, the user input can be an electronic map or a portion of an electronic map, including geographic and/or population-related information associated with the region characterized by the map, e.g., an urban, suburban, or rural type of region, with reference to which the final representation is to be generated. As another example, the user input can specify a modification, e.g., addition to or deletion from, the set of aggregation rules that is currently followed by the engine when generating the final representation. For example, the user input can be an upload from a remote user of a system over a data communication network, e.g., through the API made available by the system. As another example, the user input can specify which data that is already maintained by the system should be used as the reference data.

After receiving the user input, the grid representation generation engine can regenerate the final representation which incorporates the new data or modification that is specified by the user input. In general, the user input allows the grid representation generation engine to generate more accurate representations of the electric power grid.

Figure 2:
FIG. 2 is a flow diagram of an example process for generating a final representation of an electric power grid.
Figure 2:
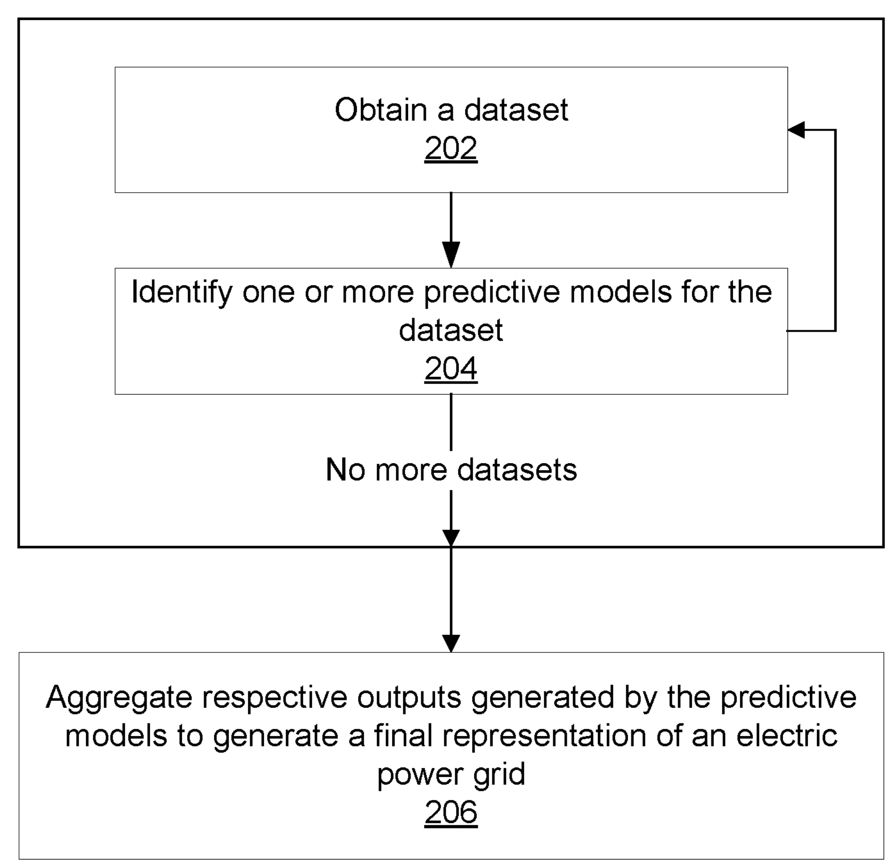

FIG. 2 is a flow diagram of an example process 200 for generating a final representation of an electric power grid. For convenience, the process 200 will be described as being performed by a system of one or more computers located in one or more locations. For example, a system that includes a grid topology generation engine, e.g., a system that includes a grid representation generation engine 130 of FIG. 1, appropriately programmed in accordance with this specification, can perform the process 200.

Generating the grid topology includes obtaining a dataset (202), identifying one or more predictive models for the dataset (204), and aggregating respective output generated by the predictive models to generate a final representation of the electric power grid (206).

In general, the system can repeatedly perform steps 202-204 to obtain different datasets, and in turn, identify respective corresponding predictive models that are each configured to generate a corresponding output that specifies a partial representation of the electric power grid.

In some implementations, the system obtains (202) a first dataset comprising imagery data taken in a geographical region that has the electric power grid. The first dataset can include one or more categories of imagery data, where the imagery data in each category includes imagery showing assets of the electric power grid in the geographical region. Example categories of imagery data include satellite imagery, aerial imagery, drone imagery, hyperspectral imaging, infrared imagery, and depth map. In general, these images will show various assets that are visible to the imaging modality.

The system identifies (204) one or more first predictive models for the first dataset. Each first predictive model can be a model that has been configured, e.g., through training, to process a respective category of imagery data to generate a corresponding output that specifies a first partial representation of the electric power grid. That is, upon having obtained the first dataset, the system can identify the one or more first predictive models based on an actual format or modality of input data that is included in the first dataset, a desired format or modality of the first partial representation, or both. The partial representation refers to, for example, a representation of respective identified locations of or connections between a particular category of assets in the geographical region, a representation of respective identified assets located within a particular portion of the geographical region, or a representation of identified connections between respective assets located within the particular portion of the geographical region.

In some implementations, the system obtains (202) a second dataset including sensor data taken in the geographical region. The second dataset can include one or more categories of sensor data. Sensor data can include raw sensor readings or measurements, data derived from raw sensor readings or measurements, or both. For example, the sensor data can include voltage, current, electric field intensity, electrical impedance, or power measurements. Example sensors include distribution line sensors, smart meters, submeters, including utility submeters, e.g., apartment or condominium submeters, or equipment submeters, e.g., HVAC, refrigerator, or washing machine submeters, consumer devices that include sensors, e.g., home accessories, e.g., Nest products, or mobile devices, standalone sensors, including wall plugs, breakers, or point-of-common connection accessories, and ground-based field sensors for transmissions. ("Nest" is a trademark of Google LLC.)

The system identifies (204) one or more second predictive models for the second dataset. As similarly described above, each second predictive model can be a model that has been configured, e.g., through training, to process a respective category of sensor data to generate a corresponding output that specifies a second partial representation of the electric power grid.

In some implementations, the system obtains (202) a third dataset including LIDAR data taken in the geographical region, the third dataset comprising one or more categories of LIDAR data. Each category of LIDAR data can be obtained by a respective LIDAR sensor on-board a moving vehicle, including, for example, car, motorcycle, drone, or airplane.

The system then identifies (204) one or more third predictive models for the third dataset. As similarly described above, each third predictive model can be a model that has been configured, e.g., through training, to process a respective category of LIDAR data to generate a corresponding output that specifies a third partial representation of the electric power grid.

In some implementations, the system obtains (202) a fourth dataset including utility data taken in the geographical region, the fourth dataset comprising one or more categories of utility data. Example categories of utility data can include data specifying utility-recorded asset locations, data collected through a supervisory control and data acquisition (SCADA) system, and data representing input from line crews. Examples of such line crew inputs include geotagged image or notes, e.g., smartphone photos, handwritten notes, or filled-out survey forms concerning the assets that are each associated with geographical identification metadata, uploaded by the line crews to the system, e.g., through a wired or wireless connection.

The system identifies (204) one or more fourth predictive models for the fourth dataset. As similarly described above, each fourth predictive model can be a model that has been configured, e.g., through training, to process a respective category of utility data to generate a corresponding output that specifies a fourth partial representation of the electric power grid.

After having repeatedly performed steps 202-204, e.g., when no more datasets are available or after a predetermined number of iterations, the system can proceed to use the predictive models to generate partial representations of the electric power grid, i.e., by processing data from the first, second, third, or fourth dataset using the identified predictive models to generate outputs that specify respective partial representations of the electric power grid.

Some or all of the outputs are associated with respective confidence scores. Each confidence score can represent a measure of quality, confidence, credibility, or any other suitable metric of the partial representation. For example, outputs generated by deterministic models, i.e., predictive models implementing deterministic algorithms, may be associated with higher confidence scores, whereas outputs generated by highly stochastic models may be associated with lower confidence scores. As another example, output generated based on processing data recently entered by line crews may be associated with higher confidence scores, whereas outputs generated based on processing history utility data may be associated with lower confidence scores.

The system aggregates information generated by the predictive models to generate a representation of the electric power grid (206). The representation of the electric power grid can identify respective geographic locations and classification of the assets of the electric power grid. The final representation can also specify the topology of the grid, i.e., respective connections and/or interrelations between these assets included in the grid.

In some implementations, the system can perform the aggregation of available information in accordance with a set of asset placement rules. Example of an asset placement rule includes: all assets must be connected to a substation, i.e., no islands; a unique path must exist from every point on the feeder back to the substation, i.e., no cycles; a riser must be connected to something else; a residential load must be no more than a maximum distance from a transformer, which distance depends on whether the region is rural, suburban, or urban; a pole must be no more than a maximum distance from another pole or other line-carrying structure.

The set of asset placement rules allows for the system to more accurately determine asset locations and, in some cases, apply appropriate adjustment or correction to asset location-related information specified by the partial representations of the electric power grid generated by the predictive models. For example, the system can ignore partial representations of distant assets that are far away from any local assets that have been predicted as being part of an electric power grid of interest. As another example, the system can infer an existence of a feeder if an island of nearby assets are being characterized by the received partial representations and, consequently, process additional data or generate a prompt to a system user, e.g., through a user interface of system, for additional data input in order to map out the inferred feeder in its entirety.

Additionally, the system can consider a set of information aggregation rules when determining grid topologies, asset locations, or both. The set of asset placement rules can assist the system in affirming, adjusting, or rejecting a partial representation, or a portion of a partial representation, that is specified by an individual output generated by a predictive model.

In some implementations, the set of information aggregation rules include responsibility rules. Example of a responsibility rule include: models processing LIDAR or imagery data can predict wire locations, and models processing utility data or sensor data can predict impedance of the wires; models processing street view LIDAR data can predict locations of utility assets, and models processing utility data can provide corresponding assets ratings using closest neighbor "snapping".

The set of responsibility rules can assist the system in selecting which predictive models for use to process different kinds of input data. The set of responsibility rules can also assist the system in affirming or rejecting a partial representation, or a portion of a partial representation, that is specified by an individual output generated by a predictive model.

In some implementations, the set of information aggregation rules include disambiguation rules. Example of a data disambiguation rule include: removing a particular output of one predictive model based on outputs generated by other predictive models that agree with one another and that outnumber the particular output, accepting outputs in accordance with associated confidence scores, or rejecting outputs that violate any of the aforementioned assets placement rules.

The set of disambiguation rules can assist the system in disambiguating the outputs by clarifying any uncertainties and removing any discrepancies or conflicts between respective partial representations specified by different model outputs. For example, outputs generated by models that process street view imagery data can be used to remove any false positive predictions in outputs generated by models that process aerial imagery; consistent model outputs, i.e., consistent true positive or true negative predictions generated by respective models based on processing different kinds of data are assigned higher confidence scores; minority inconsistent outputs, e.g., particular false negative predictions generated by a particular model are assigned lower confidence scores and can be corrected by using outputs that are consistent in majority; outputs associated with higher confidence scores are more likely to be accepted; outputs associated with lower confidence scores are more likely to be rejected.

In some implementations, the system can generate the final representation of the electric power grid by performing a two-stage process: (i) automatically determining grid topology, i.e., how assets are connected within the electric power grid, e.g., by using one or more first predictive models to process aerial imagery, orthogonal or oblique imagery data, and then (ii) automatically identifying locations of assets within the electric power grid, e.g., by using one or more second predictive models that are different from the first ones to process localized data, e.g., street view camera imagery or LIDAR data, drone imagery data, or utility data, e.g., line crew inputs. This is described in more detail below.

Figure 3:
FIG. 3 is a flow diagram of an example process for aggregating information available for processing by a grid representation generation engine.
Figure 3:
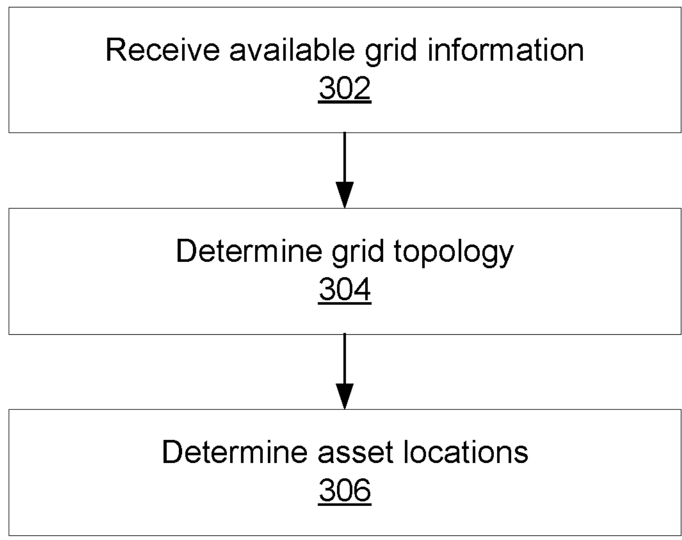

FIG. 3 is a flow diagram of an example process for aggregating information available for processing by a grid representation generation engine. For convenience, the process 300 will be described as being performed by a system of one or more computers located in one or more locations. For example, a system that includes a grid topology generation engine, e.g., a system that includes a grid representation generation engine 130 of FIG. 1, appropriately programmed in accordance with this specification, can perform the process 300.

The system receives input electric power grid information (302) For example, the information can include the first, second, third, and fourth dataset, information derived from one or more of the datasets, or both.

The system automatically determines the topology of the electric power grid (304). In other words, the system generates information representing connections between different assets of interest, e.g., assets located within a geographical area or corresponding to a user-specified region on a map. For example, the system can use a predictive model to process aerial imagery to generate an initial topology of the electric power grid. For example, the system can train a convolutional neural network to detect and/or classify assets from input images. The model can for example process aerial imagery data, orthogonal or other oblique imagery data that shows assets of the electric power grid in the geographical region and to identify assets of interest, including fundamental assets that generally define the topology of the grid ("anchor point assets"), e.g., utility poles, as well as associated assets, e.g., (underground) power lines, electrical cables, or wires, that are required to facilitate the connections between those assets.

The system automatically identifies assets on the topology (306). In other words, the system can determine the locations and classifications of assets that are included in the electric power grid represented by the initial topology. For example, the system can generate information that references a map or a top-down view image of a region. For example, the system use a different second predictive model than the one used to determine the initial topology. The second model, which can be, for example, a separate convolutional neural network, can process localized data to identify assets attached to or associated with locations along the initial topology generated from step 304. Example localized data may include street view camera imagery or LIDAR data, drone imagery data, or utility data, e.g., line crew inputs, to name just a few example.

In particular, the system can make use of determined location information of fundamental assets to determine which localized datasets should be accessed and analyzed. For example, the system can select, from multiple localized datasets each including data taken in a different region, one or more selected localized dataset that correspond to the region in which the already identified utility poles are located. For example, the selected localized dataset can include street view camera imagery data that shows crossarms, transformers, insulators, switches, reclosers, risers, or capacitors attached to each of the utility poles.

In general, the system can repeat the steps of 304, 306, or both until a complete representation of the entire electric power grid has been generated, including adjusting or refining currently determined grid topology or asset locations and classifications. Additionally or alternatively, the system can provide for display on a user device, e.g., a smart phone or tablet, the generated representation of the electric power grid.

By making use of this system in determining grid topology and asset locations and classifications, a utility company can effectively leverage information that is readily available, without having to additionally dispatch its employees in doing any manual data collection or decision-making. In various cases, such information can allow for the utility company to automatically and more effectively maintain or operate its power grids. For example, the system can facilitate automated interconnection or automatic load balancing, whereas manual inspection and decision making would take days if not weeks to complete.

As one concrete example, the system can run imagery assets through the two-stage process described above to generate a high-accuracy representation of the topology of the electricity grid as well as assets that are on the grid. The system can then use this information to automatically direct electricity flows to different parts of the grid, e.g., to direct electricity to a first area instead of a second area. For example, to increase efficiency, the system can automatically increase the efficiency of the system by increasing electricity flows through assets that have higher-efficiency and decrease electricity flows through assets that are older or less efficient. Alternatively or in addition, the system can use the automatically generated topology to automatically redirect electricity in the event of a blackout or other power outage.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit.). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

In this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework, a Microsoft Cognitive Toolkit framework, an Apache Singa framework, or an Apache MXNet framework.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

In addition to the embodiments described above, the following embodiments are also innovative:

Embodiment 1 is a method for generating a representation of an electric power grid, the method comprising:

obtaining two or more datasets comprising data indicate a presence of or operation of assets of the electric power grid in a geographical region that has the electric power grid, each dataset including data of a particular kind;

identifying one or more respective predictive models for each dataset, each predictive model being configured to process the respective kind of data of the respective dataset to generate a corresponding output that specifies a respective partial representation of the electric power grid;

generating a respective partial representation of the electric power grid from each of the predictive models that have been identified for the two or more datasets; and aggregating, in accordance with a set of aggregation rules, the respective partial representations to generate a final representation of the electric power grid.

Embodiment 2 is the method of embodiment 1, wherein obtaining two or more datasets comprises obtaining two or more of a first dataset, a second dataset, a third dataset, or a fourth dataset, wherein:

the first dataset comprises imagery data taken in the geographical region, the first dataset comprising one or more categories of imagery data, the imagery data in each category including imagery showing assets of the electric power grid in the geographical region;

the second dataset comprises sensor data taken in the geographical region, the second dataset comprising one or more categories of sensor data, the sensor data in each category including sensor measurements of assets of the electric power grid in the geographical region;

the third dataset comprises LIDAR data taken in the geographical region, the third dataset comprising one or more categories of LIDAR data; and the fourth dataset comprises utility data taken in the geographical region, the fourth dataset comprising one or more categories of utility data.

Embodiment 3 is the method of any one of embodiments 1 or 2, wherein obtaining two or more datasets comprises obtaining the first dataset, the second dataset, the third dataset, and the fourth dataset.

Embodiment 4 is the method of any one of embodiments 1-3, wherein the electric power grid comprises one or more transmission networks and one or more distribution networks; and generating the representation of the electric power grid comprises generating a representation of feeders within the electric power distribution networks, and generating a representation of high voltage power lines that connect one or more power generators to one or more substations within the electric power transmission networks.

Embodiment 5 is the method of any one of embodiments 1-4, further comprising:

providing the generated representation of the electric power grid for display on a user device.

Embodiment 6 is the method of any one of embodiments 1-5, wherein generating the corresponding output that specifies the partial representation of the electric power grid comprises generating data that identifies respective geographic locations and categories of the assets of the electric power grid in the geographical region.

Embodiment 7 is the method of any one of embodiments 1-6, wherein generating the corresponding output that specifies the partial representation of the electric power grid comprises generating data that identifies respective physical characteristics of the assets of the electric power grid in the geographical region.

Embodiment 8 is the method of any one of embodiments 1-5, wherein generating the corresponding output that specifies the partial representation of the electric power grid comprises generating data that identifies respective connections between Embodiment 9 is the method of any one of embodiments 1-8, wherein the one or more categories of imagery data comprise satellite imagery, aerial imagery, drone imagery, hyperspectral imagery, or infrared imagery.

Embodiment 10 is the method of any one of embodiments 1-8, wherein the one or more categories of sensor data comprise distribution line sensor data, smart meter readings, equipment submeter readings, consumer device readings, including readings from sensors for home accessories and mobile devices, standalone sensor data, including readings from sensors in wall plugs or breakers, or ground-based field sensor data.

Embodiment 11 is the method of any one of embodiments 1-8, wherein the one or more categories of LIDAR data comprise data obtained by respective LIDAR sensors onboard one or more moving ground or aerial vehicles.

Embodiment 12 is the method of any one of embodiments 1-8, wherein the one or more categories of utility data comprise data specifying utility-recorded asset locations, data collected through supervisory control and data acquisition (SCADA) system, or data specifying input from line crews.

Embodiment 13 is the method of any one of embodiments 1-8, wherein the one or more categories of sensor data or utility data comprise voltage, current, or electromagnetic field intensity measurements.

Embodiment 14 is the method of any one of embodiments 1-13, wherein the set of aggregation rules comprises one or more disambiguation rules, and wherein aggregating the respective outputs generated by the predictive models comprises disambiguating the respective outputs in accordance with the one or more disambiguation rules.

Embodiment 15 is the method of embodiment 14, wherein the one or more disambiguation rules comprise one or more of:

removing a particular output of one predictive model based on outputs generated by other predictive models that agree with one another and that outnumber the particular output, accepting outputs in accordance with associated confidence scores, or rejecting outputs that violate one or more assets placement rules.

Embodiment 16 is the method of any one of embodiments 1-15, further comprising:

receiving a user input specifying one or more modifications to the final representation; and regenerating the final representation by incorporating the user-specified modifications.

Embodiment 17 is the method of any one of embodiments 1-16, wherein generating the final representation of the electric power grid comprises:

determining, based on processing the aerial imagery data using a first predictive model, a topology of the electric power grid; and identifying, based on processing localized data using a second predictive model different from the first predictive model, the assets on the topology.

Embodiment 18 is the method of any one of claims 1 to 17, further comprising using the automatically generated topology to direct electricity to a first area instead of a second area.

Embodiment 19 is a system comprising: one or more computers and one or more storage devices storing instructions that are operable, when executed by the one or more computers, to cause the one or more computers to perform the method of any one of embodiments 1 to 18.

Embodiment 20 is a computer storage medium encoded with a computer program, the program comprising instructions that are operable, when executed by data processing apparatus, to cause the data processing apparatus to perform the method of any one of embodiments 1 to 18.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for generating a composite representation of an electric power grid, the method comprising:

obtaining two or more datasets comprising data indicating a presence of or operation of assets of the electric power grid in a geographical region that has the electric power grid, each dataset including data of a particular kind, wherein the assets comprise utility poles and connecting lines between the utility poles;

identifying one or more respective predictive models for each dataset, each predictive model being configured to process the respective kind of data of the respective dataset to generate a corresponding output that specifies a respective partial representation of the electric power grid;

generating, using each of the predictive models that have been identified for the two or more datasets, respective partial representations of the electric power grid that each characterize a different electrical aspect of the electric power grid in the geographical region, wherein the generating comprises:

generating, using a first predictive model that is configured as a convolutional neural network, predicted locations of the utility poles included in the assets based on processing a first dataset that comprises imagery data of the geographical region, and assigning the predicted locations of the utility poles as locations of anchor points for a composite representation of the electric power grid; and aggregating, in accordance with a set of aggregation rules, the respective partial representations to generate the composite representation of the electric power grid, wherein the composite representation of the electric power grid comprises information about the locations of the anchor points and information about connections between the anchor points, wherein aggregating comprises removing a particular output of one predictive model based on output generated by at least one other predictive model such that the particular output is excluded from the composite representation of the electric power grid.

2. The method of claim 1, wherein obtaining two or more datasets comprises obtaining two or more of the first dataset, a second dataset, a third dataset, or a fourth dataset, wherein:

the second dataset comprises sensor data taken in the geographical region, the second dataset comprising one or more categories of sensor data, the sensor data in each category including sensor measurements of assets of the electric power grid in the geographical region;

the third dataset comprises LIDAR data taken in the geographical region, the third dataset comprising one or more categories of LIDAR data; and the fourth dataset comprises utility data taken in the geographical region, the fourth dataset comprising one or more categories of utility data.

3. The method of claim 2, wherein obtaining two or more datasets comprises obtaining the first dataset, the second dataset, the third dataset, and the fourth dataset.

4. The method of claim 2, wherein the one or more categories of sensor data comprise distribution line sensor data, smart meter readings, equipment submeter readings, consumer device readings, including readings from sensors for home accessories and mobile devices, standalone sensor data, including readings from sensors in wall plugs or breakers, or ground-based field sensor data.

5. The method of claim 2, wherein the one or more categories of LIDAR data comprise data obtained by respective LIDAR sensors on-board one or more moving ground or aerial vehicles.

6. The method of claim 2, wherein the one or more categories of utility data comprise data specifying utility-recorded asset locations, data collected through supervisory control and data acquisition (SCADA) system, or data specifying input from line crews.

7. The method of claim 2, wherein the one or more categories of sensor data or utility data comprise voltage, current, or electromagnetic field intensity measurements.

8. The method of claim 1, wherein:

the electric power grid comprises one or more electric power transmission networks and one or more electric power distribution networks; and generating the representation of the electric power grid comprises generating a representation of feeders within the electric power distribution networks, and generating a representation of high voltage power lines that connect one or more power generators to one or more substations within the electric power transmission networks.

9. The method of claim 1, further comprising:

providing the generated representation of the electric power grid for display on a user device.

10. The method of claim 1, wherein the at least one respective partial representation further comprises a representation of categories of the assets.

11. The method of claim 1, wherein generating the corresponding output that specifies the partial representation of the electric power grid comprises generating data that identifies respective physical characteristics of the assets of the electric power grid in the geographical region.

12. The method of claim 1, wherein generating the corresponding output that specifies the partial representation of the electric power grid comprises generating data that identifies respective connections between respective assets of the electric power grid.

13. The method of claim 1, wherein the imagery data comprise one or more of: satellite imagery, aerial imagery, drone imagery, hyperspectral imagery, infrared imagery, or depth map.

14. The method of claim 13, wherein the composite representation comprises a topological representation of the electric power grid.

15. The method of claim 14, further comprising using the topological representation to direct electricity to a first area instead of a second area.

16. The method of claim 1, wherein the set of aggregation rules comprises one or more disambiguation rules, and wherein aggregating the respective partial representations comprises disambiguating a corresponding output of each predictive model in accordance with the one or more disambiguation rules, and wherein the one or more disambiguation rules comprise rejecting outputs of the predictive models that violate one or more assets placement rules.

17. The method of claim 1, removing the particular output of the one predictive model based on outputs generated by the at least one other predictive model comprises removing the particular output when outputs from at least two other predictive models that agree with one another and do not agree with the particular output.

18. The method of claim 1, further comprising:

receiving a user input specifying one or more modifications to the composite representation; and regenerating the composite representation by incorporating the modifications.

19. A system comprising one or more computers and one or more storage devices storing instructions that when executed by the one or more computers cause the one or more computers to perform operations for generating a composite representation of an electric power grid, the operations comprising:

obtaining two or more datasets comprising data indicating a presence of or operation of assets of the electric power grid in a geographical region that has the electric power grid, each dataset including data of a particular kind, wherein the assets comprise utility poles and connecting lines between the utility poles;

identifying one or more respective predictive models for each dataset, each predictive model being configured to process the respective kind of data of the respective dataset to generate a corresponding output that specifies a respective partial representation of the electric power grid;

generating, using each of the predictive models that have been identified for the two or more datasets, respective partial representations of the electric power grid that each characterize a different electrical aspect of the electric power grid in the geographical region, wherein the generating comprises:

generating, using a first predictive model that is configured as a convolutional neural network, predicted locations of the utility poles included in the assets based on processing a first dataset that comprises imagery data of the geographical region, and assigning the predicted locations of the utility poles as locations of anchor points for a composite representation of the electric power grid; and aggregating, in accordance with a set of aggregation rules, the respective partial representations to generate the composite representation of the electric power grid, wherein the composite representation of the electric power grid comprises information about the locations of the anchor points and information about connections between the anchor points, wherein aggregating comprises removing a particular output of one predictive model based on output generated by at least one other predictive model such that the particular output is excluded from the composite representation of the electric power grid.

20. The system of claim 19, wherein obtaining two or more datasets comprises obtaining two or more of the first dataset, a second dataset, a third dataset, or a fourth dataset, wherein:

the second dataset comprises sensor data taken in the geographical region, the second dataset comprising one or more categories of sensor data, the sensor data in each category including sensor measurements of assets of the electric power grid in the geographical region;

the third dataset comprises LIDAR data taken in the geographical region, the third dataset comprising one or more categories of LIDAR data; and the fourth dataset comprises utility data taken in the geographical region, the fourth dataset comprising one or more categories of utility data.

21. The system of claim 19, wherein the composite representation comprises a topological representation of the electric power grid.

22. One or more non-transitory computer storage media storing instructions that when executed by one or more computers cause the one or more computers to perform operations for generating a composite representation of an electric power grid, the operations comprising:

obtaining two or more datasets comprising data indicating a presence of or operation of assets of the electric power grid in a geographical region that has the electric power grid, each dataset including data of a particular kind, wherein the assets comprise utility poles and connecting lines between the utility poles;

identifying one or more respective predictive models for each dataset, each predictive model being configured to process the respective kind of data of the respective dataset to generate a corresponding output that specifies a respective partial representation of the electric power grid;

generating, using each of the predictive models that have been identified for the two or more datasets, respective partial representations of the electric power grid that each characterize a different electrical aspect of the electric power grid in the geographical region, wherein the generating comprises:

generating, using a first predictive model that is configured as a convolutional neural network, predicted locations of the utility poles included in the assets based on processing a first dataset that comprises imagery data of the geographical region, and assigning the predicted locations of the utility poles as locations of anchor points for a composite representation of the electric power grid; and aggregating, in accordance with a set of aggregation rules, the respective partial representations to generate the composite representation of the electric power grid, wherein the composite representation of the electric power grid comprises information about the locations of the anchor points and information about connections between the anchor points, wherein aggregating comprises removing a particular output of one predictive model based on output generated by at least one other predictive model such that the particular output is excluded from the composite representation of the electric power grid.

* * * * *